(12) United States Patent
Seol

(10) Patent No.: US 8,125,825 B2
(45) Date of Patent: *Feb. 28, 2012

(54) MEMORY SYSTEM PROTECTED FROM ERRORS DUE TO READ DISTURBANCE AND READING METHOD THEREOF

(75) Inventor: Bong-Gwan Seol, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 25 days.

This patent is subject to a terminal disclaimer.

(21) Appl. No.: 12/791,077

(22) Filed: Jun. 1, 2010

(65) Prior Publication Data

US 2010/0241796 A1   Sep. 23, 2010

Related U.S. Application Data

(63) Continuation of application No. 12/181,408, filed on Jul. 29, 2008, now Pat. No. 7,751,238.

(30) Foreign Application Priority Data

Aug. 3, 2007   (KR) .................................. 2007-78262

(51) Int. Cl.
   *G11C 11/34*   (2006.01)
   *G11C 16/04*   (2006.01)
   *G11C 8/00*   (2006.01)

(52) U.S. Cl. ........... 365/185.02; 365/185.11; 365/185.2; 365/236

(58) Field of Classification Search ............. 365/185.02, 365/185.11, 185.2, 236

See application file for complete search history.

(56) References Cited

U.S. PATENT DOCUMENTS

| | | | |
|---|---|---|---|
| 7,751,238 B2* | 7/2010 | Seol | 365/185.02 |
| 2005/0193161 A1* | 9/2005 | Lee et al. | 711/103 |
| 2007/0011421 A1* | 1/2007 | Keller et al. | 711/165 |
| 2008/0144450 A1* | 6/2008 | Chen | 369/30.01 |
| 2009/0310408 A1* | 12/2009 | Lee et al. | 365/185.03 |

* cited by examiner

*Primary Examiner* — Ly D Pham
(74) *Attorney, Agent, or Firm* — Muir Patent Consulting, PLLC

(57) ABSTRACT

A method of reading a memory system including a flash memory includes: reading data from a page in a first block of the flash memory, incrementing a counter each time data is read from the page to store a corresponding number of read-out cycles of the flash memory, and copying data from the first block of the flash memory to a second block of the flash memory when the counter exceeds a reference number of read-out cycles. The data from the first block includes data from the page.

29 Claims, 6 Drawing Sheets

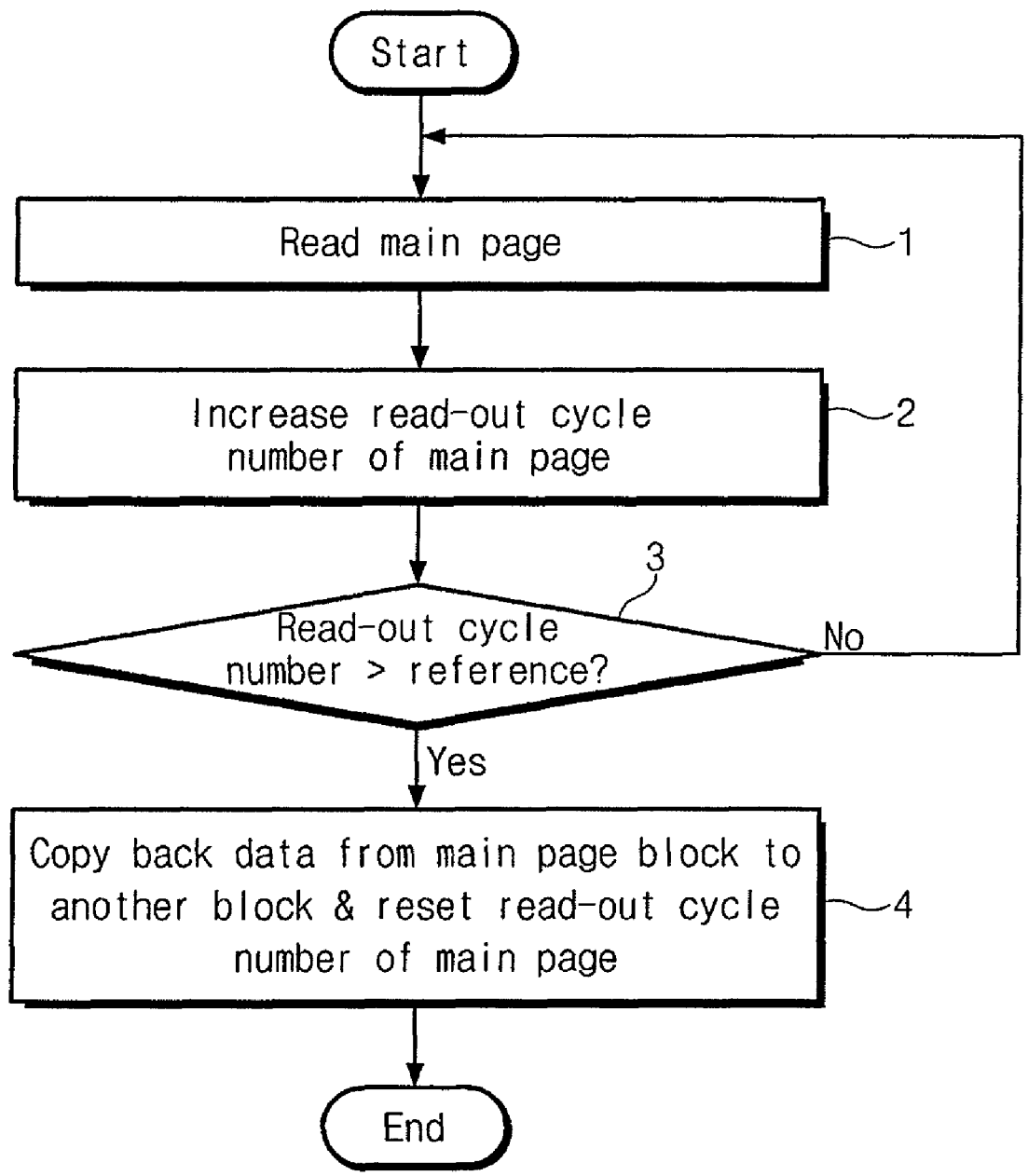

US 8,125,825 B2

MEMORY SYSTEM PROTECTED FROM ERRORS DUE TO READ DISTURBANCE AND READING METHOD THEREOF

CROSS-REFERENCE TO RELATED APPLICATIONS

This application is a continuation of application Ser. No. 12/181,408 filed on Jul. 29, 2008, now U.S. Pat. No. 7,751,238 which claims priority to Korean Patent Application No. 2007-78262, filed on Aug. 3, 2007, the disclosures of which are each incorporated herein by reference in their entireties.

BACKGROUND

1. Technical Field

The present disclosure relates to memory systems. More particularly, the present disclosure relates to a memory system protected from errors caused by read disturbances and a method thereof.

2. Discussion of Related Art

Technologies for detecting and correcting errors provide effective recovery of data that are damaged due to various reasons. For example, while storing data in a memory, the data may be damaged by perturbations in transmission channels through which the data are transferred from a source location to a target location.

Conventional technologies for error detection and correction include the use of Reed-Solomon (RS) codes, Hamming codes, Bose-Chaudhuri-Hocquenghem (BCH) codes, and cyclic redundancy codes (CRC). These codes can be used to detect and correct damaged or faulty data.

Data may be stored in nonvolatile memories (e.g., flash memories) together with coded values called error correction codes (hereinafter, referred to as 'ECC data'). The ECC data may be used to correct errors generated during a read-out operation of the flash memory. However, there is a limit to the number of bits that may be corrected using the ECC data. FIG. 1 is a circuit diagram of a conventional flash memory device and FIG. 2 is a timing diagram showing a read-out operation of the flash memory device of FIG. 1.

The flash memory includes a memory cell array having a plurality of memory blocks. FIG. 1 shows a unit memory block BLK. The memory block BLK is formed of NAND strings, each coupled to a different bit line. Each string includes a string selection transistor SST, a ground selection transistor GST, and memory cells (e.g., cell transistors) MC0~MCn-1 connected between the selection transistors SST and GST in series. The gates of the selection transistors SST and GST are connected to a corresponding NAND string and ground selection lines SSL and GSL, respectively. The control gates of the cell transistors MC0~MCn-1 are coupled each to their corresponding word lines WL0~WLn-1. Bit lines BL0 and BL1 are connected to their corresponding page buffers PB.

During a read-out operation, as shown in FIG. 2, a selected word line (e.g., WL0) is driven to a voltage of 0V while deselected word lines (e.g., WL1~WLn-1) are driven to a read voltage Vread. Accordingly, the string and ground selection lines SSL and GSL are driven to the read voltage Vread. The page buffers PB supply the bit lines BL0 and BL1 with sensing currents.

The voltages of the bit lines BL0 and BL1 are determined by the states of the memory cells that are coupled to a selected word line. For example, when a memory cell coupled to a selected word line is an on-cell, a voltage of its corresponding bit line decreases to a ground voltage. Alternately, when a memory cell coupled to a selected word line is an off-cell, a voltage of its corresponding bit line increases to a power voltage. The voltage of the bit lines are sensed by their corresponding page buffers PB as cell data.

For convenience of description, a memory cell coupled to a deselected word line is hereinafter referred to as 'deselected memory cell' and a memory cell coupled to a selected word line is hereinafter referred to as 'selected memory cell'.

When cell data is read from selected memory cells, the read voltage Vread is applied to word lines of deselected memory cells. The read voltage Vread is set to a level that is large enough to turn on cell transistors that are set to an off state.

During the read-out operation, the read voltage Vread is applied to control gates of the deselected cell transistors and the ground voltage is applied to a substrate (e.g., a bulk) of the deselected cell transistors. The drains of the deselected cell transistors are supplied with a predetermined voltage. The application of the read voltage Vread and the ground voltage causes a bias condition during the read-out operation.

As illustrated in FIG. 3, the bias condition can cause electrons to be injected into a floating gate of the deselected cell transistor from the substrate during the read-out operation. The electrons can result in an unintentional programming (or soft programming) of a deselected cell transistor in on-state (or erased state), which is referred to as a 'read disturbance'.

A read disturbance may cause threshold voltages of the on-state (or erased state) memory cells to gradually increase. As noted by the shaded area shown in FIG. 4, threshold voltages of the on-state memory cells increase in proportion to number of read-out operations that are performed. The voltage increases may cause some of the on-state memory cells to be erroneously detected as off-cells, resulting in read fails.

As the number of read-out operations performed increases, the probability of a read fail increases as shown in FIG. 5. If the number of bit errors exceeds a permissible range, a block corresponding thereto is treated as a bad block. The bad block containing the erroneous data is replaced by a reserved memory block, which is stored in the flash memory device. Here, the bad block is caused by a read disturbance, and not worn out by repetition of the programming or reading operation. Therefore, the bad block may be reused through erasure and replacement.

However, repeated reading of several pages of the block, may damage data of other pages. For example, when repeatedly reading a music file, which is stored in a specific page using an MP3 player, a read disturbance may occur because the read voltage Vread is continuously applied to the other pages of the block. However, error correction cannot be performed when there are too many bit errors.

Thus, there is a need for memory systems and methods thereof that can protect memories from bit errors caused by read disturbances.

SUMMARY OF THE INVENTION

An exemplary embodiment of the present invention includes a memory system. The memory system includes a flash memory and memory controller. The flash memory includes a plurality of pages. The memory controller controls an operation of the flash memory. The memory controller reads data from a page of a first block of the flash memory, increases a counter when data is read from a page to store a corresponding number of read-out cycles of the flash memory, and copies data from the first block into a second block of the flash memory when the counter exceeds a reference number of read-out cycles. The data from the first block includes data of the page.

An exemplary embodiment of the present invention includes a method of reading data from a memory system. The memory system includes a flash memory. The method includes reading data from a page in a first block of the flash memory, incrementing a counter each time data is read from the page to store a corresponding number of read-out cycles of the flash memory, and copying data from the first block of the flash memory to a second block of the flash memory when the counter exceeds a reference number of read-out cycles. The data from the first block includes data from the main page.

The page may be a main page of the first block. The reference number of read-out cycles may be set by a user. The flash memory may include a storage unit for storing the number of read-out cycles. The flash memory may include a memory controller that includes a storage unit for storing the number of read-out cycles. The storage unit may be a buffer memory. The copying of data may be performed when the flash memory is powered on. The reading method may further include resetting the counter after the data is copied.

BRIEF DESCRIPTION OF THE DRAWINGS

The present invention will become readily apparent by reference to the following detailed description when considered in conjunction with the accompanying drawings, wherein:

FIG. 7 is a flow chart showing a reading method in the memory system of FIG. 6, according to an exemplary embodiment of the present invention.

DETAILED DESCRIPTION OF EXEMPLARY EMBODIMENTS

Figure 1:
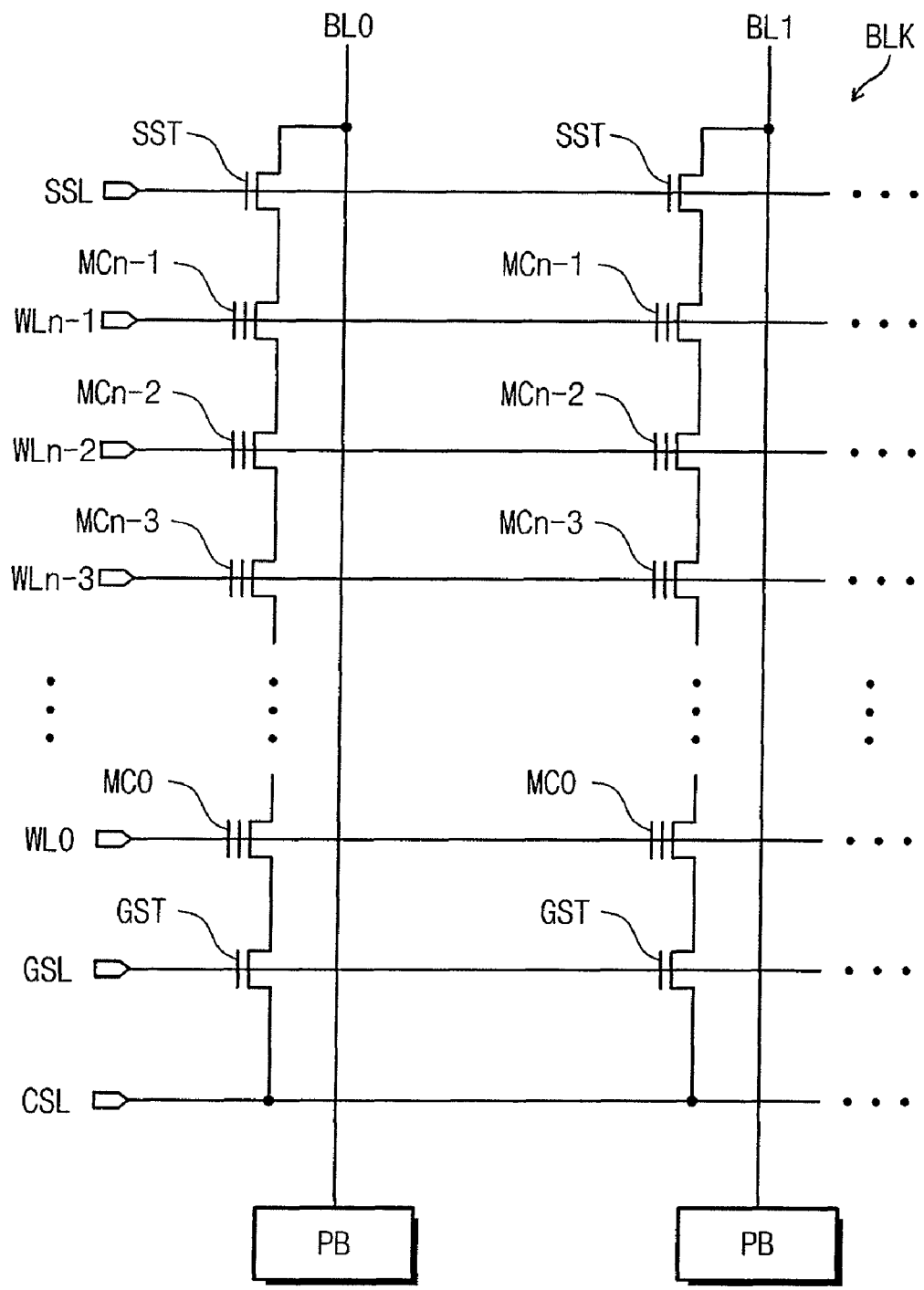
FIG. 1 is a circuit diagram of a general flash memory device.
Figure 2:
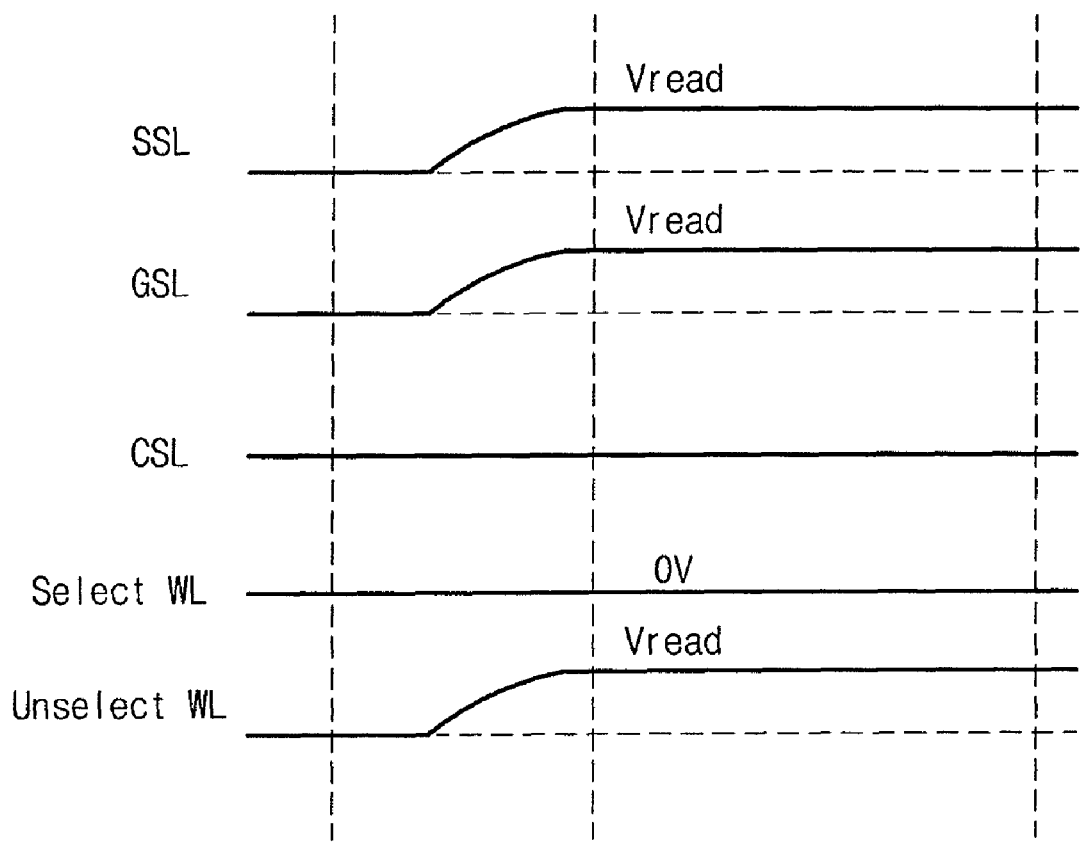
FIG. 2 is a timing diagram showing a read-out operation of the flash memory device of FIG. 1.
Figure 3:
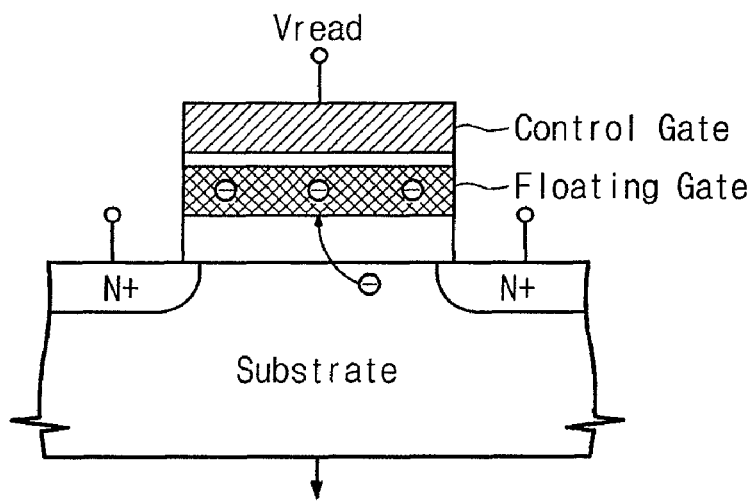
FIG. 3 is a sectional diagram illustrating a soft programming effect caused by a read disturbance.
Figure 4:
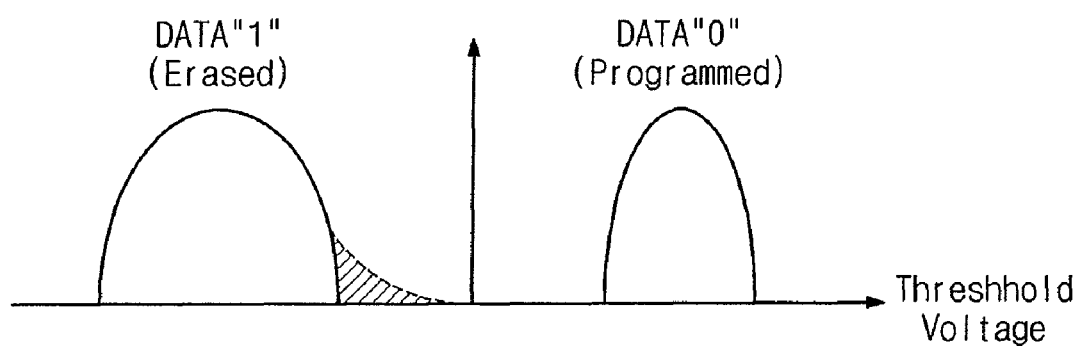
FIG. 4 is a graphic diagram showing threshold voltage distributions corresponding to on and off-cells.
Figure 5:
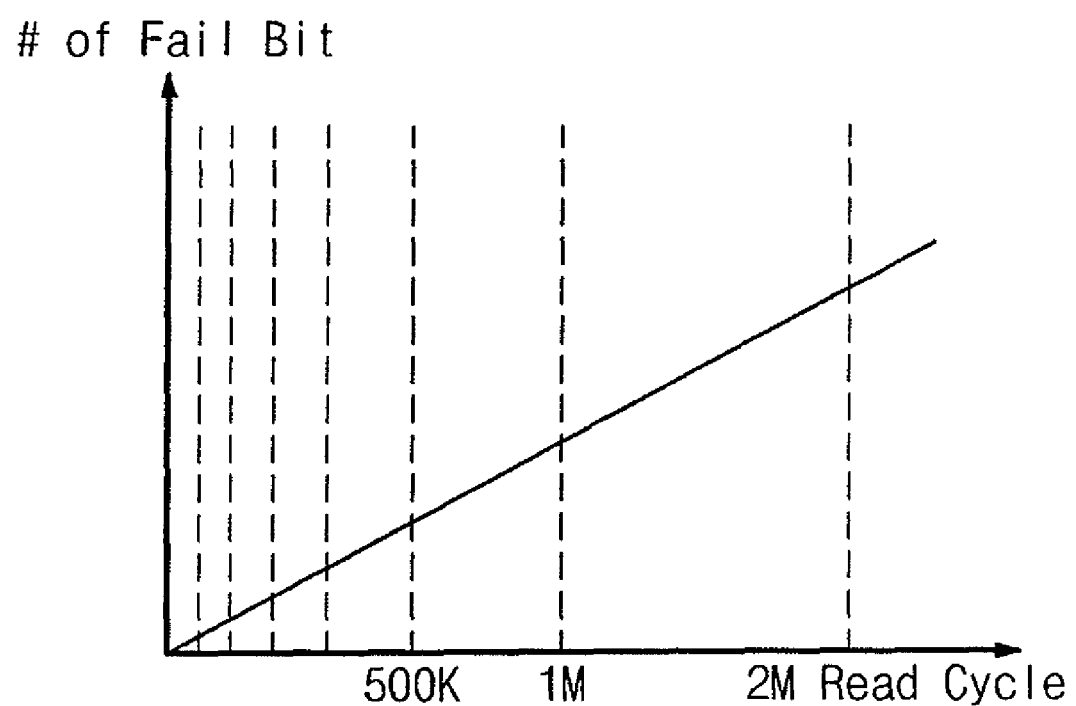
FIG. 5 is a graphic diagram showing correlations between read cycles and read fails.

Exemplary embodiments of the present invention will be described below in more detail with reference to the accompanying drawings. Like reference numerals refer to like elements throughout the accompanying drawings.

A memory system and reading method thereof according to at least one embodiment of the present invention is configured to prevent bit errors in other pages that are caused by repeated reading of data from a main page (or a specific page).

As a read voltage is applied to the main page, the main page and other pages are affected by a read disturbance. According to at least one embodiment of the present invention, the reading of a flash memory includes backing up data of a block included in the main page when the number of read-out cycles exceeds a reference number of cycles.

Hereinafter, exemplary embodiments of the present invention will be described in conjunction with the accompanying drawings.

Figure 6:
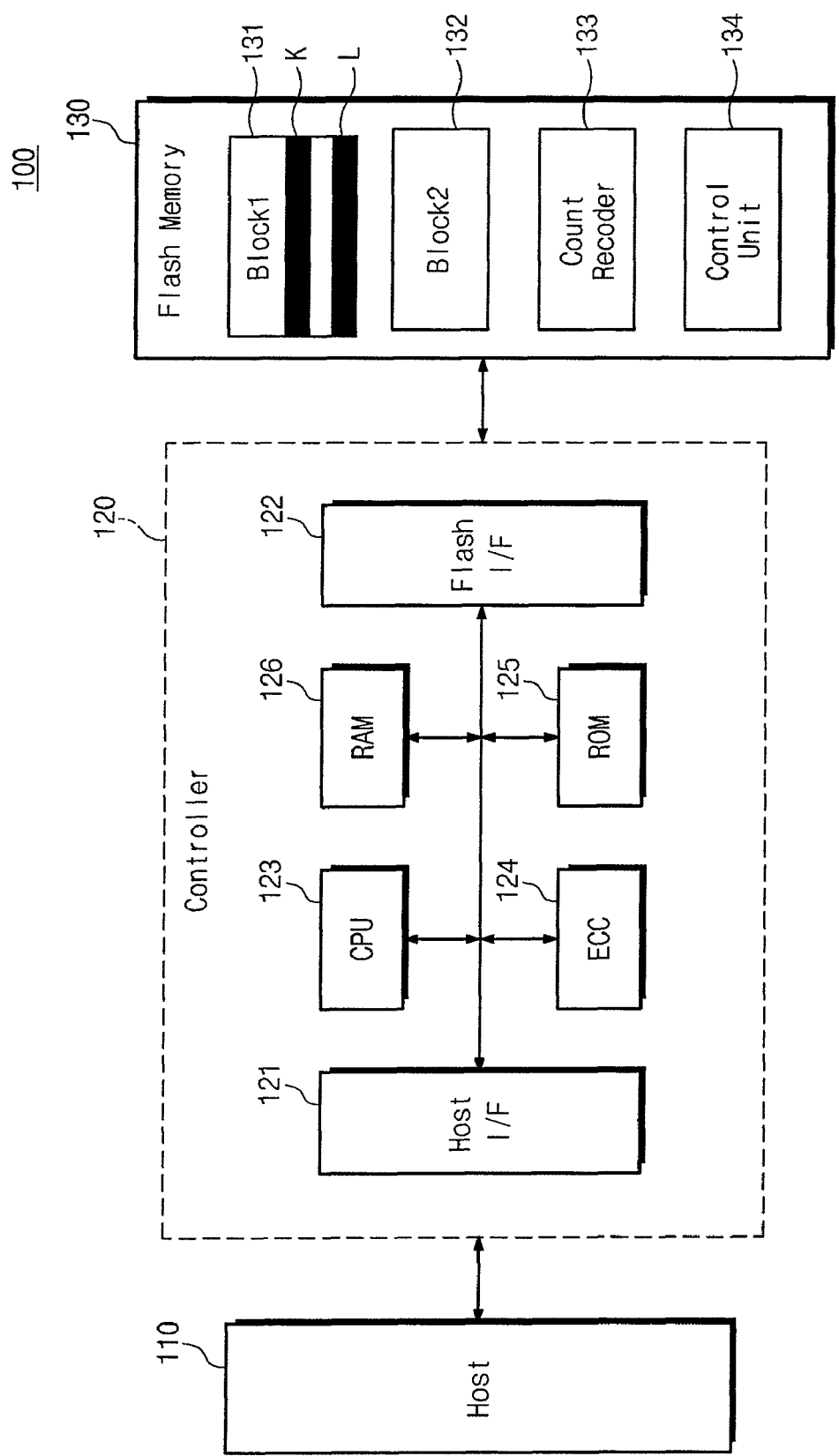
FIG. 6 is a block diagram showing a memory system according to an exemplary embodiment of the present invention.

FIG. 6 is a block diagram showing a memory system according to an exemplary embodiment of the present invention. Referring to FIG. 6, the memory system 100 includes a host 110, a memory controller 120, and a flash memory 130.

Referring to FIG. 6, the memory controller 120 and the flash memory 130 may be included in a single storage unit. The single storage unit may be a mobile device such a memory card (e.g., MultiMedia card (MMC), Secure Digital (SD) card, eXtreme Digital (xD) card, CompactFlash (CF) card, or Subscriber Identity Module (SIM) card). The mobile storage device may be linked with a host 110 such a computer, a laptop, a digital camera, a mobile phone, an MP3 player, a portable multimedia player, or a gaming machine.

The memory system 100 operates to prevent bit errors in rest pages (hereinafter, referred to as 'dummy pages'), while the host 110 repeatedly reads data only from one or more specific pages (hereinafter, referred to as 'main page(s)') of the flash memory 130.

The flash memory 130 of FIG. 6 illustrates a main page K and a dummy page L where a bit error occurs during a read-out operation of the main page K. A bit error of the dummy page L may be caused by, for example, the repeated listening of a music file stored in the main page K from an MP3 player, or the repeated playing of an entertainment program stored in the main page K using a gaming machine.

The memory controller 120 repeatedly reads data from the main page K of the flash memory 130 in response to a request of the host 110. During the reading operations, a ground voltage (e.g., 0V) is applied to a selected cell of the main page K, while a Vread voltage is applied to the dummy pages and deselected cells. The continuous reading of data from the main page K causes the dummy pages and deselected cells to be softly programmed.

When a bit error caused by soft programming occurs, an ECC circuit 124 repairs the bit error. However, when a bit error is not corrected using an ECC algorithm of the ECC circuit 124, a method in accordance with an exemplary embodiment of the present invention performs a data backup of the soft-programmed block into another block before further bit errors can be generated.

The backup operation copies data of a memory block, which includes erroneous pages, into another memory block so that the erroneous page data caused by the read disturbance can be restored. This prevents the number of bit errors in the data from exceeding the permissible range of errors that an ECC circuit 124 can handle.

For example, data of a memory block including a main page are copied back into another block when the number of read-out cycles to the main page exceeds a reference number of cycles. The reference number of cycles may be set by a user. For example, the reference number of cycles may be set to 1000. For example, when the number of read-out cycles to the main page exceeds 1000, data of a block, which includes the main page, is copied into another block.

While FIG. 6 shows a block includes one main page K and one dummy page L, the present invention is not limited thereto. For example, a block may include multiple main and dummy pages.

As illustrated in FIG. 6, the memory controller 120 includes a host interface 121, a flash interface 122, a central processing unit (CPU) 123, am ECC circuit 124, a read-only memory (ROM) 125, and a random access memory (RAM) 126. When there is a read request by the host 110, the memory controller 120 selects the main page K and reads data from the main page K.

The controller 120 counts the number of read-out cycles to the main page whenever data is read from the main page K.

The counted number of read-out cycles may be stored in the RAM 126 by the memory controller 120.

The host interface 121 is configured to interface with the host 110 and the flash interface 122 is configured to interface with the flash memory 130. The CPU 123 operates to control the reading or writing operation of the flash memory 130 in response to a request by the host 110.

The ECC circuit 124 generates ECC data by transferring data to the flash memory 130. The ECC data is stored in a spare area of the flash memory 130. The ECC circuit 124 detects bit errors of data that are read out from the flash memory 130. If bit errors are detected as being in a permissible range, the ECC circuit 124 is able to correct the detected bit errors. The ECC circuit 124 may be disposed in the flash memory 130, or external to the memory controller 120. For example, the disposition of the flash memory may be based on a type of the memory system 100.

The ROM 125 can store data such as boot codes and the RAM 126 may be used as a buffer memory. The RAM 126 can temporarily store data read from the flash memory 130 or data provided from the host 110. The RAM 126 may also store a flash transition layer (FTL). The FTL can be managed by the CPU 123. The RAM 126 may be of a dynamic or static type.

The RAM 126 can be configured to store table information for managing read error information. The table information may be stored as meta-data in a meta-area of the flash memory 130 under control of the CPU 123. The table information may be copied to the RAM 126 from the meta-area of the flash memory 130 during a power-on time.

Referring back to FIG. 6, the flash memory 130 also includes a cell array including first and second memory blocks 131 and 132, a count recorder 133, and a control unit 134. The count recorder 133 stores the numbers of read-out cycles to all pages of all blocks. Although not shown in FIG. 6, the control block 134 may include a row decoder, a column decoder, a page buffer, a bit-line selection circuit, and a data buffer.

The cell array includes a plurality of memory blocks. While FIG. 6 shows only the first and second memory blocks 131 and 132 as the plurality of memory blocks, the present invention is not limited thereto. For example, the flash memory 130 may include various numbers of memory blocks.

Each of the first and second memory blocks 131 and 132 include a plurality of pages (e.g., 32 or 64 pages). Each page includes a plurality of memory cells (e.g., 512 or 2K Bytes). In a NAND flash memory, an erasing operation is carried out in the unit of a memory block, but the reading and writing operations are carried out in the unit of page. The flash memory 130 may be configured to store single-bit data or multi-bit data.

Before powering down the memory system 100, the memory controller 120 stores information about the number of read-out cycles of the main page K into the count recorder 133 from the RAM 126. When the memory system is powered on, the memory controller 120 loads the information about the number of read-out cycles into the RAM 126 from the count recorder 133.

FIG. 7 is a flow chart showing a method of reading the memory system of FIG. 6, according to an exemplary embodiment of the present invention. Referring to FIGS. 6 and 7, in response to a power-on of the memory system 100, the memory controller 120 stores the information of the numbers of read-out cycles about all pages of all blocks into the RAM 126 from the count recorder 133. Then, the host 110 requests a read of the main page K of the flash memory 130. The memory controller 120 executes the read-out operation to the main page K in response to the read request of the host 110 (step 1). The memory controller 120 increases the number of read-out cycles (e.g., a counter, register, or variable storing the number of read-out cycles may be incremented) to the main page K when data is read from the main page K (step 2). The memory controller 120 compares the number of read-out cycles of the main page K with the reference number of cycles (step 3).

When the number of read-out cycles to the main page K exceeds the reference number of cycles, the memory controller 120 copies data into the second memory block 132 from the first memory block 131 including the main page K and resets the number of read-out cycles (step 4). For example, when the read-out cycles are stored in a counter, the contents of the counter would be reset.

When there is damaged data or a data error in the main page K of the first memory block 131 shown in FIG. 6, a copy-back programming operation or a backup operation for copying data into the second memory block 132 from the first memory block 131 may be performed.

When the memory system 100 is powered up, the memory controller 120 may load the number of read-out cycles of the main page K into the RAM 126 from the count recorder 133 of the flash memory 130.

According to at least one embodiment of the present invention, while repeatedly reading data from a main page K, a ground voltage (e.g., 0V) is applied to the main page K and a read voltage Vread is applied to a dummy page L.

Since the read voltage Vread is applied to the main page, the main page K is also affected by read disturbance as well as the dummy page L. A method of reading the flash memory according to an exemplary embodiment of the present invention is executed by copying-back or backup up data into the second memory block 132 from the first memory block 131 including the main page K when the number of read-out cycles exceeds a reference number of cycles. Therefore, at least one embodiment of the present invention can be used to protect flash memory from bit errors caused by a read disturbance while repeatedly reading data from a specific page.

While exemplary embodiments of the present invention have been described, it is understood that the present invention is not limited to these exemplary embodiments, but various changes and modifications can be made by one ordinary skilled in the art within the spirit and scope of the present invention.

What is claimed is:

1. A method of reading a flash memory, comprising:
reading a first page in a first block of the flash memory;
incrementing a count of read-out cycles in connection with the reading of the first page;
comparing a reference value with the count of read-out cycles;
copying data from the first block to a second block of the flash memory in response to the comparing; and
storing the count of read-out cycles into the flash memory before powering down.

2. The method as set forth in claim 1, further comprising storing in a RAM the count of read-out cycles.

3. The method as set forth in claim 2, wherein the RAM is a DRAM or a SRAM.

4. The method as set forth in claim 2, further comprising copying table information stored as meta-data in the flash memory to the RAM.

5. The method as set forth in claim 1, wherein the copying comprises a copy-back programming operation for copying the data from the first block to the second block of the flash memory.

6. The method as set forth in claim 1, wherein the reference number is set by a user.

7. The method as set forth in claim 1, wherein the count of read-out cycles is a count of read-out cycles of the first page.

8. The method of claim 1, wherein the flash memory is a NAND flash memory.

9. The method of claim 1, wherein the flash memory is configured to store multi-bit data.

10. A method of operating a MP3 player comprising the method of claim 1.

11. A method of operating a Secure Digital card comprising the method of claim 1.

12. The method as set forth in claim 1, further comprising:
controlling the flash memory with a memory controller; and
storing the counted number of read-out cycles in a storage unit.

13. The method as set forth in claim 12, further comprising copying table information stored as meta-data in the flash memory to the storage unit.

14. The method as set forth in claim 12, further comprising copying the counted number of read-out cycles from the flash memory into the storage unit in response to the memory system being powered on.

15. A method of reading a flash memory comprising:
receiving a request by a host to access music data stored in the flash memory;
repeatedly reading a page of a first block of the flash memory in which the music data is stored;
analyzing a risk of read failure due to a read disturbance in the first block of the flash memory, wherein the step of analyzing comprises comparing a read-out cycle count to a reference number, the read-out cycle count being incremented in connection with the reading of the music data in the page of the first block, and the method further;
in response to the analyzing, causing the music data to be copied to a second block of the flash memory, and
storing the count of read-out cycles into the flash memory before powering down.

16. The method as set forth in claim 15, further comprising storing the read-out cycle count in a storage area of the flash memory.

17. The method as set forth in claim 16, wherein the storage area of the flash memory is located outside the first block and the second block.

18. The method of claim 15, wherein the flash memory is a NAND flash memory.

19. The method of claim 15, wherein the flash memory is configured to store multi-bit data.

20. The method of claim 15, wherein the step of analyzing comprises detecting a bit error caused by a soft programming.

21. A memory system comprising:
a host interface;
a flash memory interface;
a flash memory comprising a plurality of blocks, each block comprising a plurality of pages; and
a memory controller configured to transfer data from the flash interface to the host interface on receiving a read request through the host interface, configured to read a page of a first block of the flash memory, configured to track a number of read-out cycles associated with the first block and configured to copy the data from the first block into a second block of the flash memory in response to the number of read-out cycles exceeding a reference number of read-out cycles and configured to cause the count of read-out cycles to be stored in the flash memory before powering down the memory system.

22. The memory system as set forth in claim 21, wherein the memory controller further comprises a host interface, a flash memory interface, a CPU, an ECC circuit and RAM, the memory controller operable to transfer data from the flash interface to the host interface on receiving a read request through the host interface, the ECC circuit of the memory controller operable to detect bit errors and to correct bit errors of the data.

23. The memory system as set forth in claim 22, wherein the flash memory controller further comprises a ROM configured to store boot codes.

24. The memory system as set forth in claim 22, wherein the CPU is configured to manage a FTL layer accessible from the RAM.

25. The memory system as set forth in claim 22, wherein the flash memory includes a meta-area to store meta-data.

26. The memory system as set forth in claim 24, wherein the controller is operable to copy the meta-data to the RAM of the controller.

27. The memory system as set forth in claim 21, wherein the flash memory is a NAND flash memory.

28. The memory system as set forth in claim 21, wherein the flash memory is configured to store multi-bit data.

29. The memory system as set forth in claim 21, wherein the memory controller comprises a count recorder to store a counted number of read-out cycles of the first block in the flash memory when one or more pages from the first block is read.

* * * * *